United States Patent
Hirasawa et al.

(10) Patent No.: US 6,840,594 B2
(45) Date of Patent: Jan. 11, 2005

(54) WORK WORKING METHOD AND APPARATUS, CASSETTE, AND UNIT FOR PRINTING APPARATUS

(75) Inventors: Shuichi Hirasawa, Ibaraki (JP); Katsumi Ishihara, Ibaraki (JP); Masatoshi Morita, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/408,120

(22) Filed: Apr. 8, 2003

(65) Prior Publication Data

US 2003/0190886 A1 Oct. 9, 2003

(30) Foreign Application Priority Data

Apr. 10, 2002 (JP) .......................... 2002-108225

(51) Int. Cl.⁷ ................. B41J 2/01; B41J 3/00
(52) U.S. Cl. .................. 347/1; 347/2; 347/104
(58) Field of Search ............... 347/1, 2, 103; 414/222.01

(56) References Cited

U.S. PATENT DOCUMENTS 6,670,621 B2 * 12/2003 Chen .................. 250/492.2

2002/0106268 A1 * 8/2002 Ueda et al. ............... 414/217
2002/0162728 A1   11/2002 Hirasawa et al. ......... 198/465.1
2003/0179252 A1 * 9/2003 Nakamura .................. 347/2

FOREIGN PATENT DOCUMENTS

| JP | 4-82057 | 3/1992 |
| JP | 5-66733 | 3/1993 |
| JP | 7-19553 | 1/1995 |
| JP | 8-313022 | 11/1996 |
| JP | 9-264575 | 10/1997 |
| JP | 11-23031 | 1/1999 |
| JP | 11-145245 | 5/1999 |

* cited by examiner

Primary Examiner—Stephen D. Meier
Assistant Examiner—Alfred Dudding
(74) Attorney, Agent, or Firm—Fitzpatrick, Cella, Harper & Scinto

(57) ABSTRACT

In a working method of performing work on a workpiece, a plurality of work chambers corresponding to work steps for the workpiece are consecutively arrayed, and a cleanliness with respect to dust particles is independently controlled in each of the work chambers. The workpiece is transferred to the respective work chambers, and working is performed in each of the work chambers in which a cleanliness is maintained below a predetermined cleanliness corresponding to the type of work on the workpiece.

2 Claims, 18 Drawing Sheets

WORK WORKING METHOD AND APPARATUS, CASSETTE, AND UNIT FOR PRINTING APPARATUS

FIELD OF THE INVENTION

The present invention relates to a working method and apparatus for parts and units having precision structures, e.g., a liquid discharging unit mounted on a printer designed to print by discharging a liquid, for which high working and assembly precisions are required, for example, removal of micro-order dust particles and the like is required.

In addition, the present invention relates to a working method and apparatus which performs working on a circuit board to mount semiconductor chips on the circuit board.

In particular, the present invention relates to a working method and apparatus which work a unit while keeping a cleanliness with a predetermined precision to prevent dust particles from adhering to the unit in a work atmosphere.

The present invention also relates to a working method which partitions a work region for a work as a work target into a plurality of independent regions, and controls the cleanliness in each work region.

BACKGROUND OF THE INVENTION

As conventional techniques associated with working and processes for integrated circuits, for example, Japanese Patent Publication Nos. 4-082057 and 5-066733, and Japanese Patent Application Laid-open No. 11-145245 are disclosed, which are classified in H01L of IPC (International Patent Classification).

As methods and apparatuses for working, assembling, and processing works which are easily affected by dust particles and unwanted components in an atmosphere with a predetermined cleanliness, for example, Japanese Patent Laid-Open Nos. 9-264575, 11-023031, 8-313022, and 7-019553 are disclosed, which are classified in F24F of Internal Patent Classification.

Along with the recent IT (Information Technology) innovation in various industrial fields, information devices have been increasingly introduced into various departments regardless of whether they are clerical or technical departments. In addition, as a result of new technical innovation of such information devices, information devices having new functions and performance have been introduced commercially.

The above situation makes it necessary to perform business management for computers and their peripheral devices, including development, design, manufacture, commercial introduction, and the like, timely in consideration of the market trend.

New devices demand a shift from the conventional automated/mechanized mass production scheme based on automated warehouses, automatic part transfer, and automatic working by robots to a production system corresponding to a so-called cell production scheme in which inventory processing is minimized in the process of production.

SUMMARY OF THE INVENTION

It is an object of the present invention to provide a new working method and apparatus which are suitable for the cell production scheme described above.

It is another object of the present invention to provide a working apparatus which maintains a work environment for each step at a predetermined cleanliness in working and processes for precision parts and units as work target objects which are easily affected by adhesion of unwanted components such as dust particles.

It is still another object of the present invention to provide a working method and apparatus which guarantee the cleanliness of a worked unit by managing a work environment under which a part is worked with respect to a work target object to be worked so as to maintain the work target object and the part at a predetermined cleanliness.

As one embodiment of the present invention, there is provided a working method for a liquid ink discharging unit for a printing apparatus designed to discharge a liquid.

With the recent proliferation of the printing apparatus, the precision requirement has increased on the customer side; required are an increase in ink dot density per unit area and an improvement in precision in the prevention of clogging of orifices.

In order to achieve the above objects, according to an aspect of the present invention, there is provided a working method of performing working of a work, characterized in that a cleanliness with respect to dust particles in a work chamber in which the work is worked is maintained hierarchically in the work chamber, and the working is performed at a position at which the cleanliness is high.

According to another aspect of the present invention, there is provided a working method of performing working of a work, characterized in that a plurality of work chambers corresponding to work steps for the work are consecutively arrayed, and a cleanliness with respect to dust particles is independently controlled in each of the work chambers, the work is transferred to the respective work chambers, and working is performed in each of the work chambers in which a cleanliness is maintained below a predetermined cleanliness corresponding to a type of working of the work.

There is a form of the work working method characterized in that a loading chamber in which a work is loaded is connected to the work chamber, and a cleanliness in the work chamber is forcibly adjusted when the work is loaded into the loading chamber.

According to still another aspect of the present invention, there is provided a working method of performing working of a work, characterized in that a cleanliness in a work chamber in which the work is worked is maintained, a cassette storing parts to be worked on the work is so disposed as to be able to be connected to the work chamber, a cleanliness in the cassette is maintained at a predetermined value, and the part is worked on the work below a predetermined cleanliness.

There is a form of the work working method characterized in that when the cassette is connected to the work chamber, a door of the cassette is opened after the door is cleaned.

According to the present invention, in order to achieve the above objects, there is provided a working apparatus for performing working of a work, characterized by comprising a work chamber in which the working is performed, the work chamber having a cleanliness atmosphere from which dust particles have been removed by a gas flow, and the cleanliness atmosphere in which a cleanliness is maintained hierarchically.

The working apparatus is characterized by further comprising means for working the work at a position at which an atmosphere is maintained at a predetermined cleanliness.

The working apparatus is characterized in that a shielding member which maintains the cleanliness at the work position is provided in the work chamber.

According to still another aspect of the present invention, there is provided a working apparatus for performing working of a work, characterized in that a plurality of work chambers corresponding to work steps for the work are arranged, and each of the work chambers includes means for independently maintaining a cleanliness, means for transferring the work to each work chamber, and process means for performing a process corresponding to each step in each of the work chambers.

According to still another aspect of the present invention, there is provided a working apparatus characterized by comprising a work chamber in which working of a work is performed, means for controlling a cleanliness in the work chamber, a cassette which can be attached/detached to/from the work chamber, and means for guaranteeing a cleanliness in the work chamber when the cassette is connected to the work chamber.

The working apparatus is characterized in that a mount portion in which the cassette is mounted comprises a first door which opens when the cassette is mounted, and a second door which opens when a part in the cassette is loaded into the work chamber.

The working apparatus is characterized by further comprising means for cleaning a door of the cassette while the first door of the work chamber is open.

According to still another aspect of the present invention, there is provided a cassette which loads a part into a work chamber in which a cleanliness is maintained, comprising connection means for connection to a connection portion of the work chamber, a door which opens upon connection to the connection portion, a tray which stores the part in the cassette, and means for loading the tray into the work chamber while floating the tray inside the cassette.

According to the present invention, there is also provided a method of working a unit for a printing apparatus which discharges a liquid, characterized in that a work forming the unit is worked at a position in a work chamber, in which a cleanliness with respect to dust particles is controlled at a position, at which the cleanliness is high, thereby preventing dust particles from adhering to the unit.

In addition, there is provided a unit for a printing apparatus which has a liquid discharging nozzle mounted on a substrate, characterized in that the unit is worked by a working apparatus having a plurality of work chambers in which a predetermined cleanliness is maintained, and a cassette which can be coupled to the work chamber and supplies the nozzle, and the substrate and the nozzle are worked in an atmosphere with a predetermined cleanliness.

According to still another aspect of the present invention, there is provided a working method for a unit for a printing apparatus which prints on a carrier by discharging a liquid, characterized in that the unit has a nozzle mounted on a substrate, the unit is worked through a plurality of independent work chambers corresponding to work steps for the unit, and the work chamber is controlled to have a cleanliness corresponding to the work step.

The working method for the unit for the printing apparatus is characterized in that the nozzle is supplied from a cassette which can be connected to the work chamber, and the cassette is connected to the work chamber while a predetermined cleanliness is maintained.

According to still another aspect of the present invention, there is provided a working method of performing working of a work, characterized in that a work atmosphere for the work is divided into a plurality of independent work regions, the divided regions being kept at a predetermined cleanliness, and the work is transferred from the first independent work region to the second independent work region by first transfer means, and the first transfer means reciprocally moves between the first and second work regions to receive and transfer the work, thereby working the work.

The work working method is characterized in that the cleanliness in each of the independent work regions is controlled independently, and the cleanliness in each of the work regions is adjusted upon transfer operation of the transfer means.

As described above, according to the present invention, there is provided a working method of performing working of a work, characterized in that a cleanliness with respect to dust particles in a work chamber in which the work is worked is maintained hierarchically in the work chamber, and the working is performed at a position at which the cleanliness is high. The provision of this method makes it possible to perform working while maintaining a high cleanliness in a work environment for assembly of precision parts and the like.

In addition, there is provided a working method of performing working of a work, characterized in that a plurality of work chambers corresponding to work steps for the work are consecutively arrayed, and a cleanliness with respect to dust particles is independently controlled in each of the work chambers, the work is transferred to the respective work chambers, and working is performed in each of the work chambers in which a cleanliness is maintained below a predetermined cleanliness corresponding to a type of working of the work. The provision of this method makes it possible to increase the degree of freedom in recombining the types of work steps.

Cleanliness can be stabilized by the work working method characterized in that a loading chamber in which a work is loaded is connected to the work chamber, and a cleanliness in the work chamber is forcibly adjusted when the work is loaded into the loading chamber.

A high cleanliness can be guaranteed by the work working method characterized in that when the cassette is connected to the work chamber, a door of the cassette is opened after the door is cleaned.

Working operation can be stabilized by a working apparatus for performing working of a work, characterized by comprising a work chamber in which the working is performed, the work chamber having a cleanliness atmosphere from which dust particles have been removed by a gas flow, and the cleanliness atmosphere in which a cleanliness is maintained hierarchically.

A reduction in cost can be attained by a working apparatus for performing working of a work, characterized in that a plurality of work chambers corresponding to work steps for the work are arranged, and each of the work chambers includes means for independently maintaining a cleanliness, means for transferring the work to each work chamber, and process means for performing a process corresponding to each step in each of the work chambers.

There is provided a working apparatus characterized by comprising a work chamber in which working of a work is performed, means for controlling a cleanliness in the work chamber, a cassette which can be attached/detached to/from the work chamber, and means for guaranteeing a cleanliness in the work chamber when the cassette is connected to the work chamber. In this working apparatus, a mount portion in which the cassette is mounted comprises a first door which opens when the cassette is mounted, and a second door which opens when a part in the cassette is loaded into the work chamber. The provision of this apparatus makes it possible to guarantee a high cleanliness.

According to an aspect of the present invention, there is provided a method of working a unit for a printing apparatus which discharges a liquid, characterized in that a work forming the unit is worked at a position in a work chamber, in which a cleanliness with respect to dust particles is controlled at a position, at which the cleanliness is high, thereby preventing dust particles from adhering to the unit. This method makes it possible to obtain a printing apparatus with a higher printing precision.

According to the present invention, there is provided a unit for a printing apparatus which has a liquid discharging nozzle mounted on a substrate, characterized in that the unit is worked by a working apparatus having a plurality of work chambers in which a predetermined cleanliness is maintained, and a cassette which can be coupled to the work chamber and supplies the nozzle, and the substrate and the nozzle are worked in an atmosphere with a predetermined cleanliness. This printing apparatus can obtain a higher printing precision.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

DETAILED DESCRIPTION OF THE PREFERRED EMBODIMENT

An embodiment of the present invention will be described below with reference to the accompanying drawings.
(Description of Apparatus Arrangement)

Figure 1:
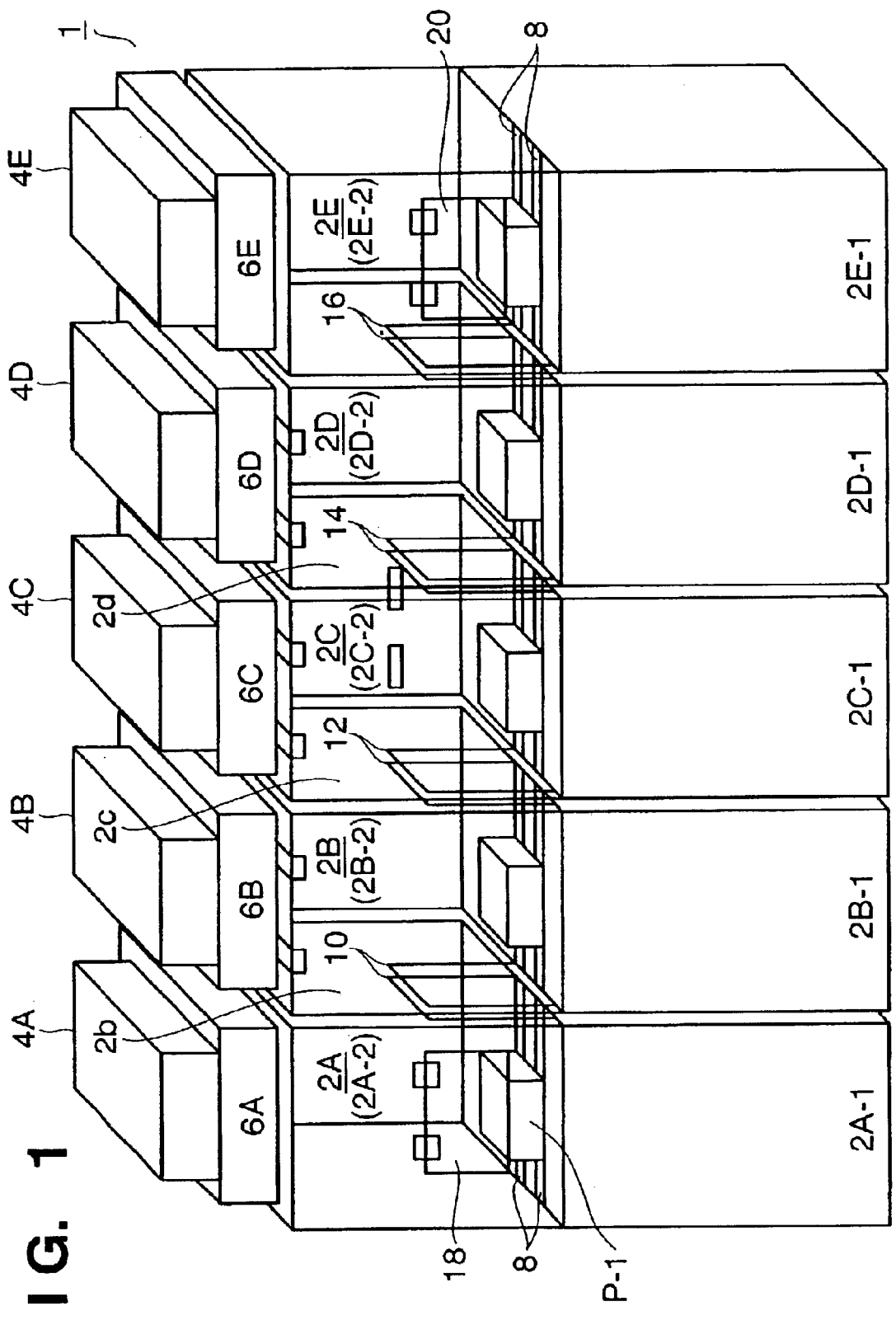
FIG. 1 is a perspective view for explaining the overall arrangement of a working apparatus according to an embodiment of the present invention.

FIG. 1 shows the overall arrangement of an apparatus. Referring to FIG. 1, reference numeral 1 denotes an overall working apparatus.

Reference numerals 2A, 2B, 2C, 2D, and 2E denote work/process chambers which respectively form independent work areas. The chamber 2A is a loading (introduction) chamber into which a work as a work target object is loaded.

The chambers 2B, 2C, and 2D are an adhesive coating work chamber, chip mounting work chamber, and ultraviolet irradiation (UV) work chamber, respectively. The chamber 2E is an unloading chamber (discharge) for unloading a worked work.

In the respective work chambers, stage bases 2A-1, 2B-1, 2C-1, 2D-1, and 2E-1 and space chambers 2A-2, 2B-2, 2C-2, 2D-2, and 2E-2 placed on the stage bases are disposed.

Reference numerals 4A, 4B, 4C, 4D, and 4E denote air blowers respectively attached to the upper portions of the above space chambers; and 6A, 6B, 6C, 6D, and 6E, cleaning means such as filters for cleaning air from the air blowers.

Reference numeral 8 denotes transfer rails placed on the above stage bases to run across the respective work chambers.

The respective work chambers are coupled to each other through the rails 8.

Opening/closing means 10, 12, 14, and 16 are provided at the connection portions of the respective work chambers.

Reference numeral 18 denotes the door of the loading chamber; and 20, the door of the unloading chamber.

Front surfaces 2b, 2c, and 2d of the work chambers 2B, 2C, and 2D in FIG. 1 are formed into openable doors that can be opened/closed for troubleshooting in the work spaces.

An example of the assembling of an ink discharging unit used for an ink-jet printer will be described below as an embodiment in which working is performed by this working apparatus.

The work step in the work chamber 2B is the step of applying an ultraviolet curing adhesive to predetermined positions on a unit substrate W loaded from the loading chamber 2A.

The work step in the work chamber 2C is the step of mounting chip parts P1 and P2 on the adhesive on the unit substrate W.

The work step in the work chamber 2D is the step of irradiating the adhesive with ultraviolet radiation.

In this embodiment, the cleanliness in each work chamber is aimed at Class 100 according to Federal Standard 209B.
(Description of Internal Arrangement of Work Chamber)
(Description of Arrangement of Loading Chamber 2A)

Figure 2:
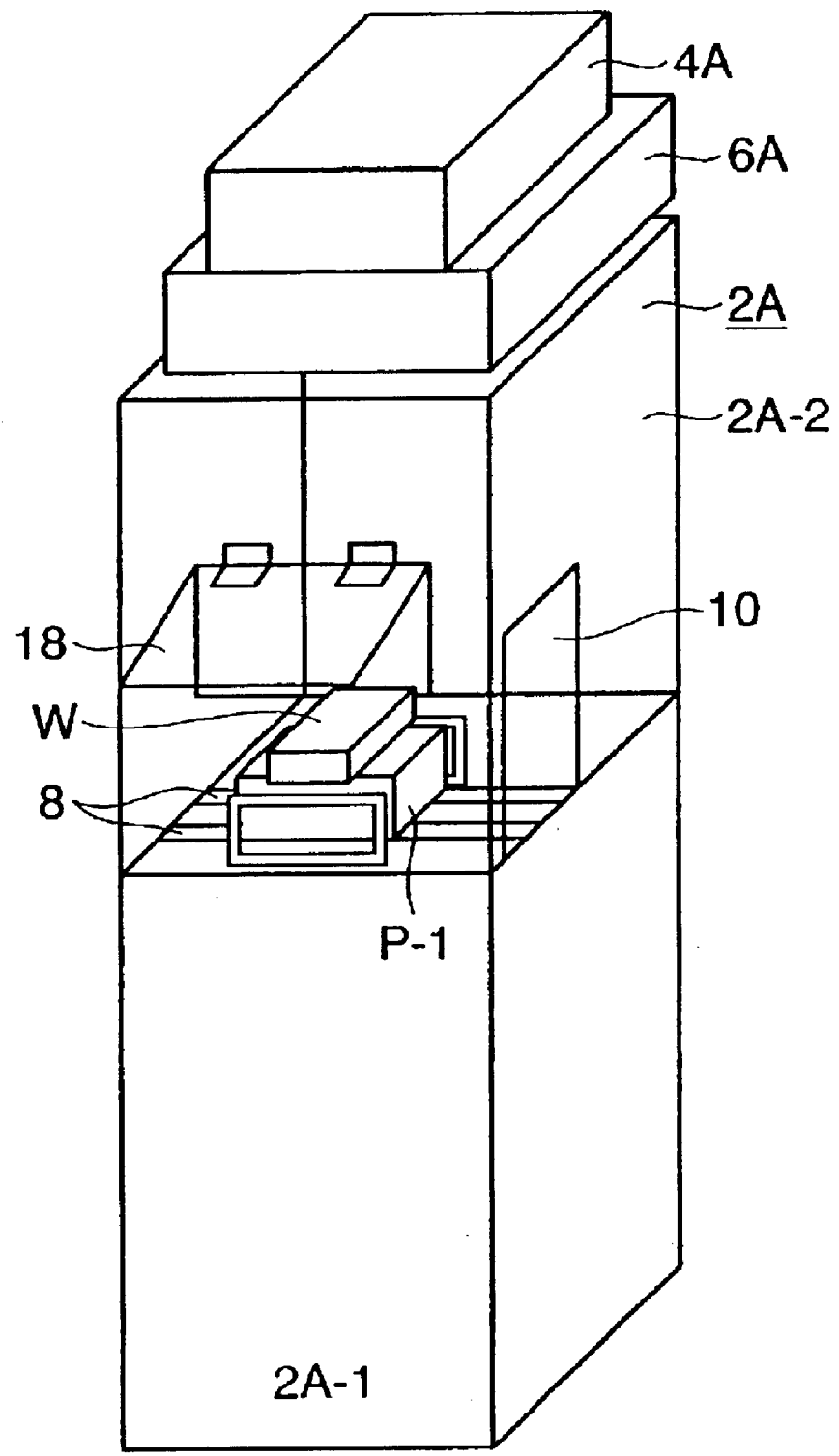
FIG. 2 is a perspective view for explaining the arrangement of a loading chamber.

FIG. 2 is a view for explaining the loading chamber 2A, in which the transfer rails 8 are placed on the stage base 2A-1 in the space chamber 2A-2 on the stage base 2A-1.

Reference symbol P-1 denotes a transfer vehicle for transferring the work W.

The opening/closing door 18 of the loading chamber 2A is opened, and the transfer vehicle P-1 on which the work W is mounted is placed on the transfer rails 8.
(Description of Work Chamber 2B)

Figure 3:
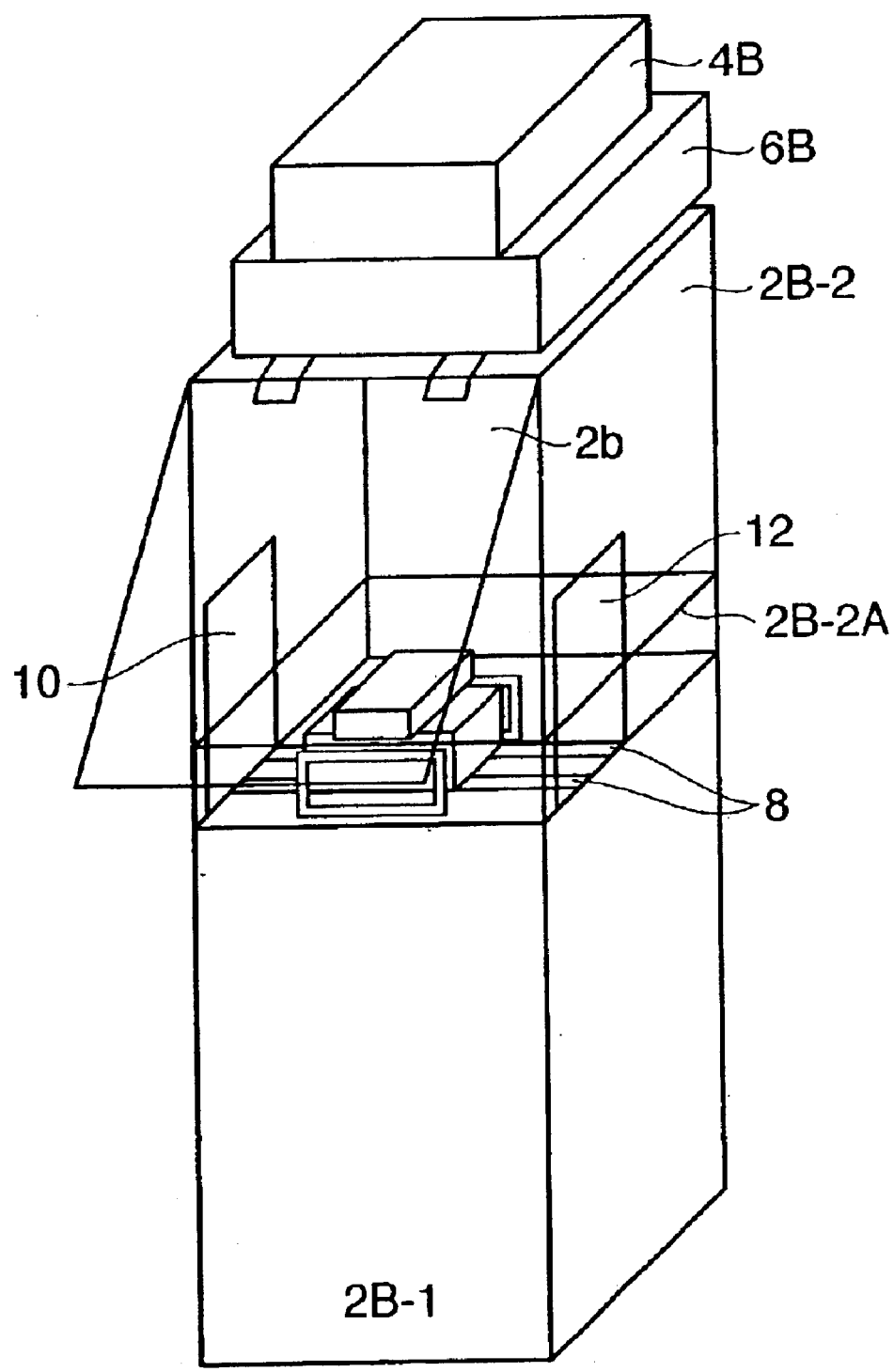
FIG. 3 is a perspective view for explaining the arrangement of a work chamber 2B.

FIG. 3 is a view for explaining the main part of the work chamber 2B, in which the transfer rails 8 run on the stage base 2B-1.

The air blower 4B for sending air from outside the apparatus into the apparatus is placed on the uppermost portion of the apparatus. This air is cleaned by the cleaning means 6B and the cleaned air is sent into the work chamber 2B-2.

A grating plate 2B-2A having countless holes each having a diameter of about 0.5 mm is placed in the work chamber 2B-2. The pressure above the grating plate can be kept higher than that below the grating plate, and the cleanliness in the space above the work W, which is required for working, can be maximized.

The front surface side of the work chamber 2B is formed into the openable door structure 2b to cope with maintenance required when a trouble occurs in the transfer vehicle or working means in the work chamber.

Referring to FIG. 3, reference numeral 2B-2A denotes a shielding member for vertically shielding the inside of the work chamber 2B. This member partitions the work chamber 2B into upper and lower portions and allows the air sent from the air blower 4B to flow in the direction of the stage base 2B-1 through the filter of the cleaning means 6B. More specifically, many through holes are formed in a transparent resin board.

This shielding member serves to ensure a high cleanliness in the work chamber 2B by preventing dust particles produced by a driving mechanism in the work chamber 2B from being scattered above the shielding member.

In this manner, the shielding member in the work chamber can maintain the cleanliness above the shielding plate at a high level.

In addition, the shielding member 2B-2A reduces the work region relative to the entire volume of the work chamber so as to maintain a high cleanliness in the region.

Figure 4:
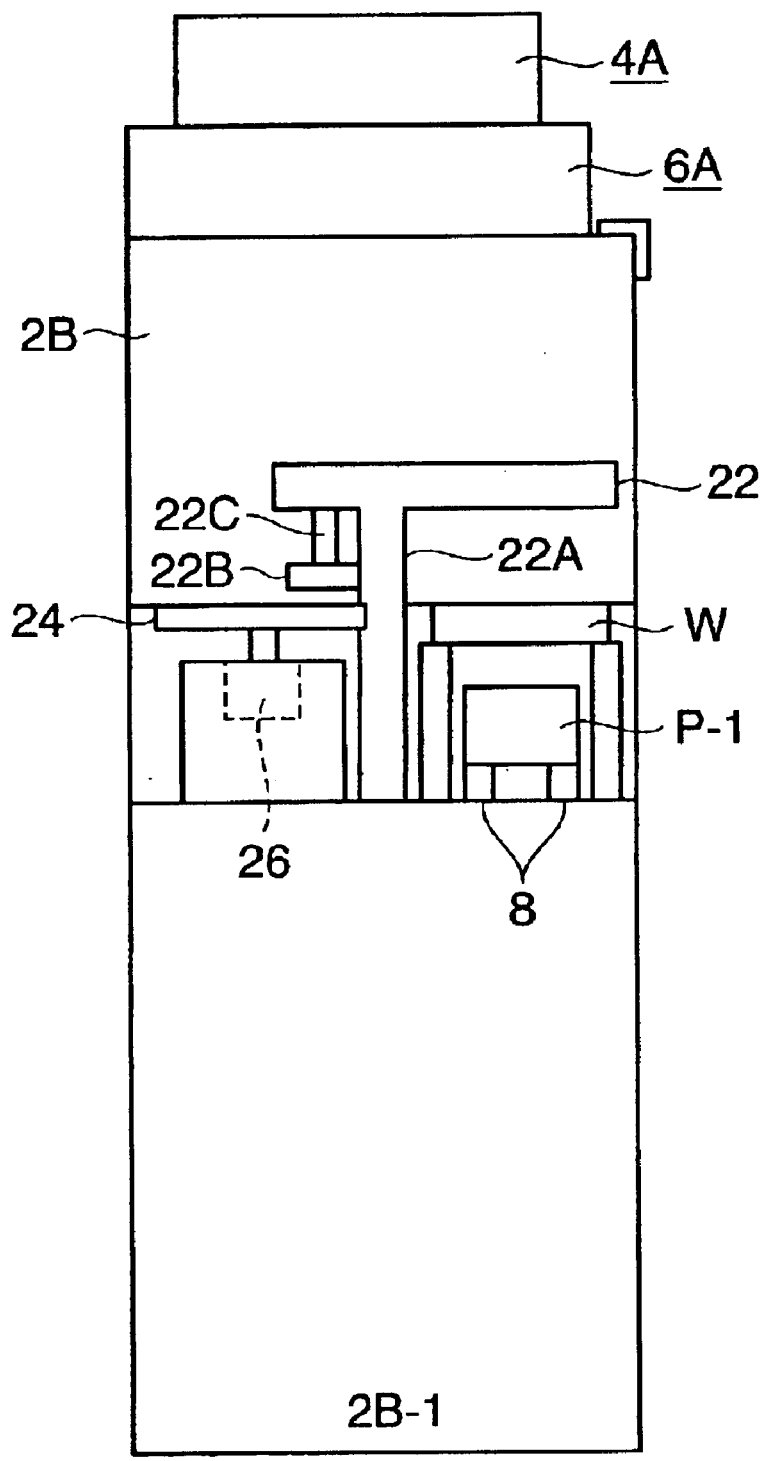
FIG. 4 is a view for explaining the main part of a side surface of the work chamber 2B.

FIG. 4 is a sectional view showing the main part of the work chamber 2B and the arrangement of working means in the work chamber.

The work chamber 2B is a chamber for the step of applying an ultraviolet curing resin to predetermined positions on the work W transferred from the loading chamber 2A.

Referring to FIG. 4, reference numeral 22 denotes an adhesive supply means. The means 22 is comprised of a rotating shaft 22A rotatably supported on the stage base 2B-1, a transfer pin 22B, a holding member 22C for holding the transfer pin 22B on the rotating shaft 22A, and the like.

The rotating shaft 22A is designed to be capable of making rotational and vertical movements.

Reference numeral 24 denotes an adhesive supply plate; and 26, a rotation means for the transfer plate.

Referring to FIG. 4, the work W transferred on the rails 8 by the transfer vehicle is stopped at predetermined positions in the work chamber 2B by a positioning means.

(Description of Work Chamber 2C)

Figure 5:
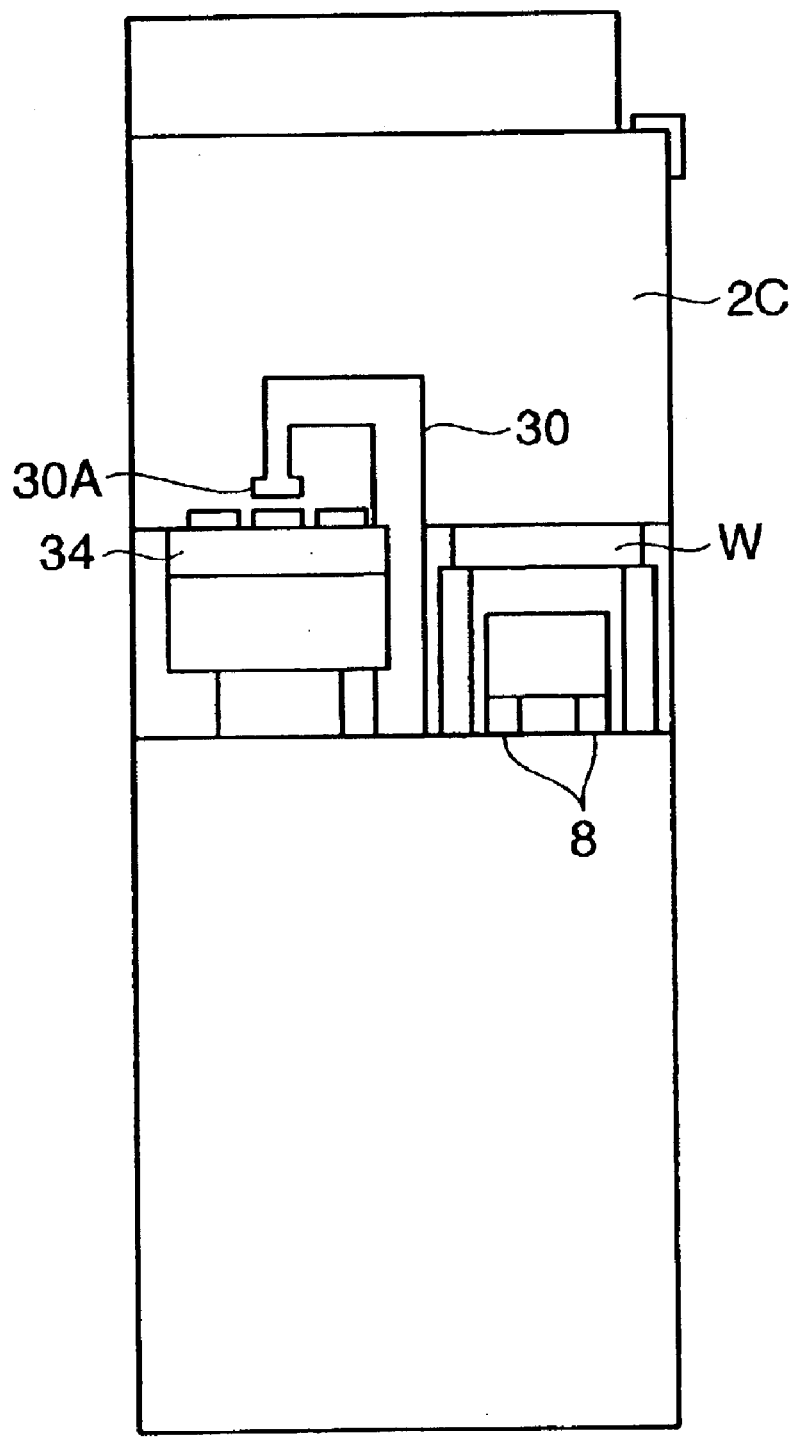
FIG. 5 is a view for explaining the arrangement of a work chamber 2C.

FIG. 5 shows the work chamber 2C. The work chamber 2C is a chamber for executing the step of mounting chip parts on the adhesive applied to the predetermined positions on the work in the work chamber 2B.

Referring to FIG. 5, reference numeral 30 denotes a robot as a working machine for mounting the chip parts P1 and P2 supplied from a cassette (to be described later) on the work W.

The robot 30 chucks/holds a chip part supplied from the cassette and placed on a tray 34, and mounts the chip part at a position on the work W, which is transferred in the work chamber 2B, held on the vehicle transferred on the transfer rails 8.

A shielding member like the one placed in the work chamber 2B is also placed in the work chamber 2C to keep the cleanliness in the work region high.

(Description of Cassette)

Figure 6:
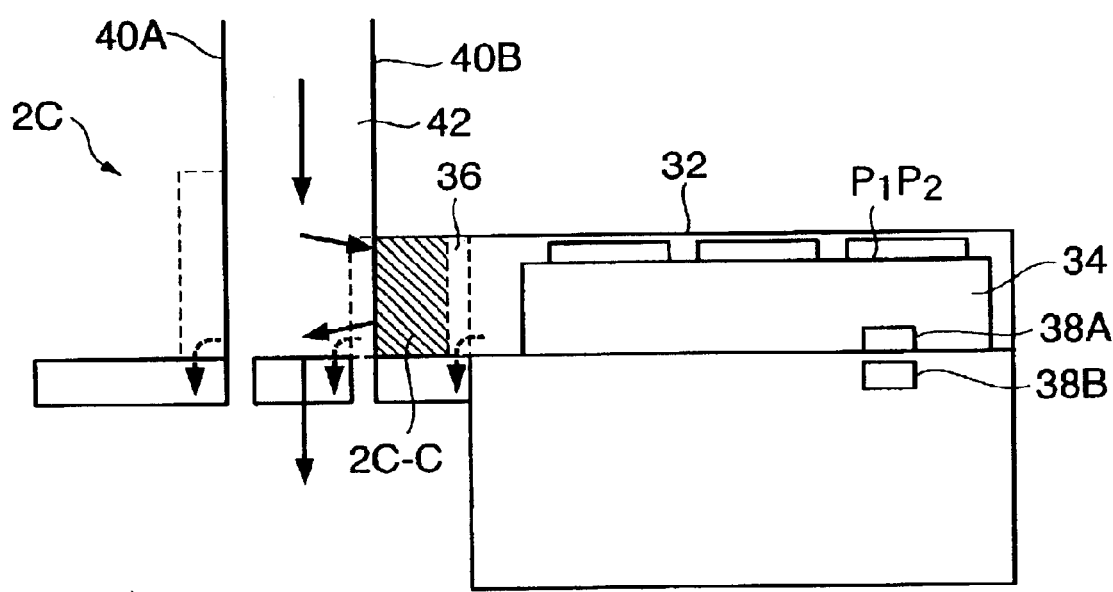
FIG. 6 is a view for explaining the arrangement of a cassette mounted in the work chamber 2C.

FIG. 6 is a view for explaining the arrangement of a cassette for supplying chip parts assembled on the work W in the work chamber 2B and the arrangement of the connection portion of work chamber 2C in which the cassette is mounted.

Referring to FIG. 6, reference numeral 32 denotes a cassette body. This cassette is made of a metal or resin in the form of a vessel, and houses the tray 34 on which the chip parts P1 and P2 are placed. A side surface of the cassette is formed into a door 36.

The door 36 is designed to open when the cassette body 32 is connected to the work chamber 2C.

As shown in FIG. 6, the work chamber 2C has a double wall constituted by first and second wall surfaces 40A and 40B. The space inside the first wall surface 40A of the double wall forms a work region for the robot 30. The space between the first and second wall surfaces 40A and 40B forms an isolated region 42. A cleaned air flow passes through the isolated region 42. When the cassette body 32 is to be connected to the work chamber 2C, the isolated region 42 serves to clean the outer surface of the door 36 of the cassette body 32 and prevent impurities adhering to the surface of the door from entering the work chamber 2C.

Reference numerals 38A and 38B denote moving means for the tray 34 in the cassette. These means are formed from magnets, and use the magnetic attraction between the first magnet 38A attached to the tray 34 in the cassette and the second magnet 38B that moves on the moving locus of the tray 34.

When the cassette is mounted in the work chamber 2C and the tray is moved from the cassette into the work chamber, the moving means cause the tray 34 in a noncontact state to move within the work chamber so as to prevent the production of dust particles when it comes into contact with constituent members.

(Description of Work Chamber 2D)

Figure 7:
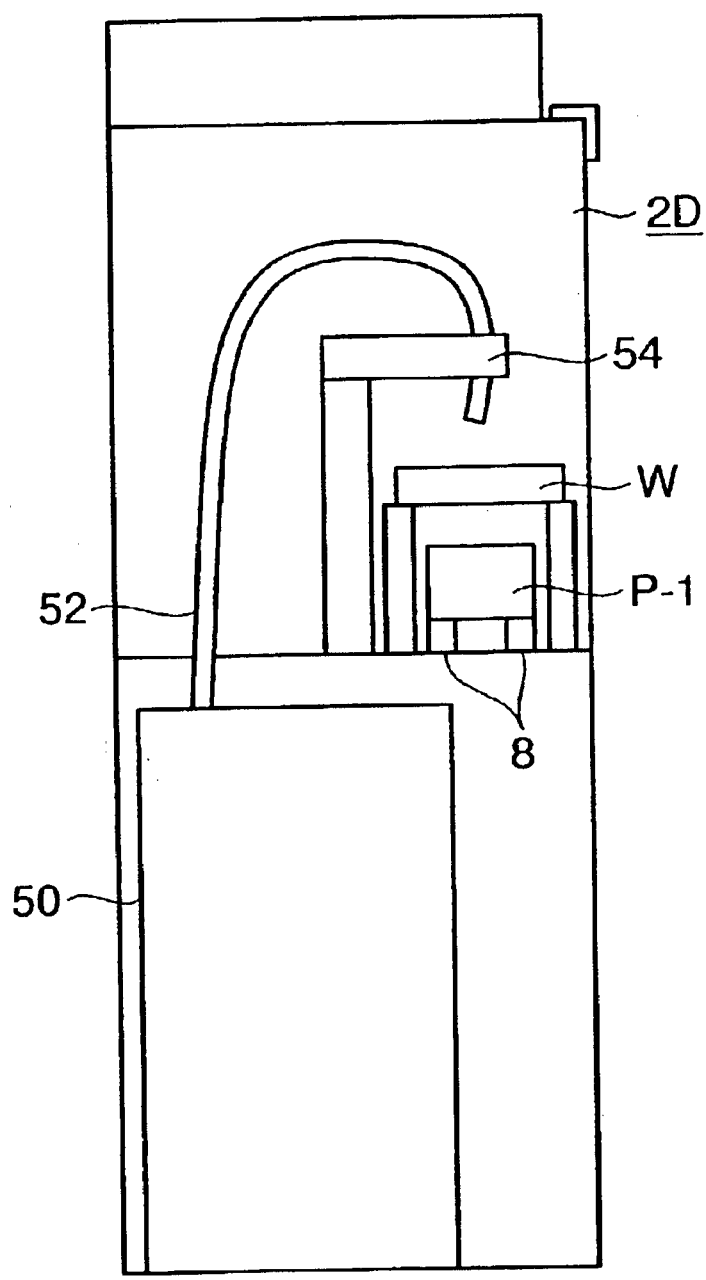
FIG. 7 is a view for explaining the arrangement of a work chamber 2D.

FIG. 7 shows the arrangement of the work chamber 2D.

The work chamber 2D is used to perform the step of irradiating the chip parts P1 and P2 on the work W, which have been coated with the adhesive, with ultraviolet radiation when the work W is transferred on the transfer rails 8.

Referring to FIG. 7, reference numeral 50 denotes an ultraviolet radiation source; 52, an ultraviolet irradiation fiber; and 54, a support member.

A shielding member is also placed in the work chamber 2D.

(Description of Work)

A work to be worked by this working apparatus and working method will be described next.

The work to be described in one embodiment is a unit corresponding to the ink discharging portion of an ink-jet printer designed to discharge ink.

An assembly process for the above ink discharging unit will be described below with reference to FIGS. 8 to 13.

Figure 8:
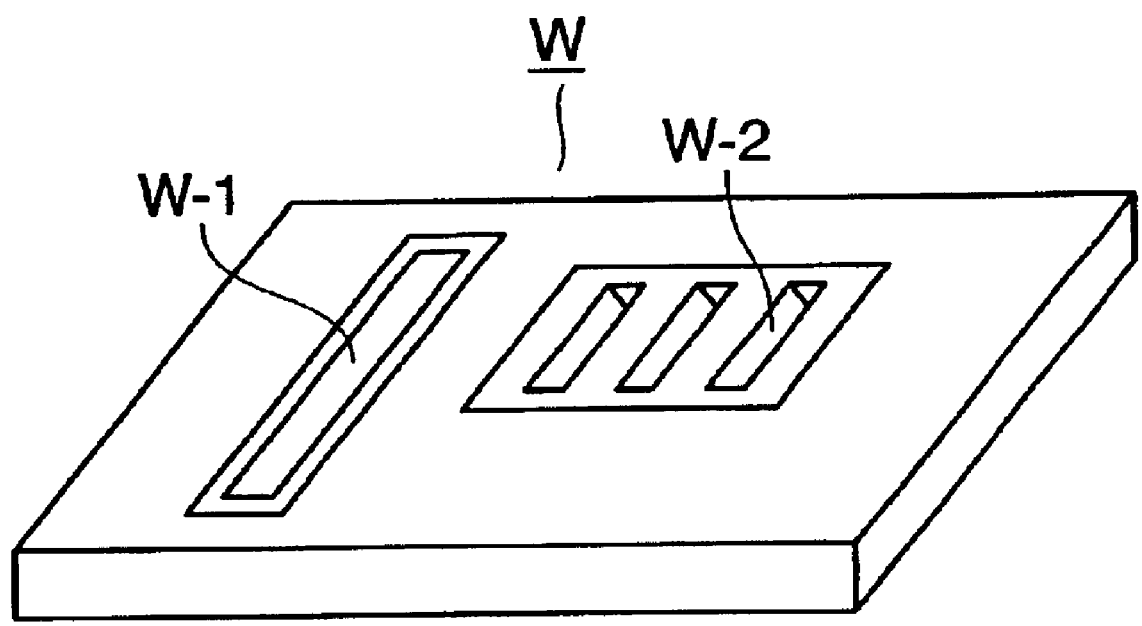
FIGS. 8 to 13 are views for explaining a unit.

FIG. 8 shows the work W. The work W is in the form of a flat plate and is made of a ceramic material.

A black ink supply groove portion W-1 and three groove portions W-2 for the supply of color inks are formed in the upper surface of the flat plate.

Each of the groove portions is cut in the flat surface portion.

Figure 9:
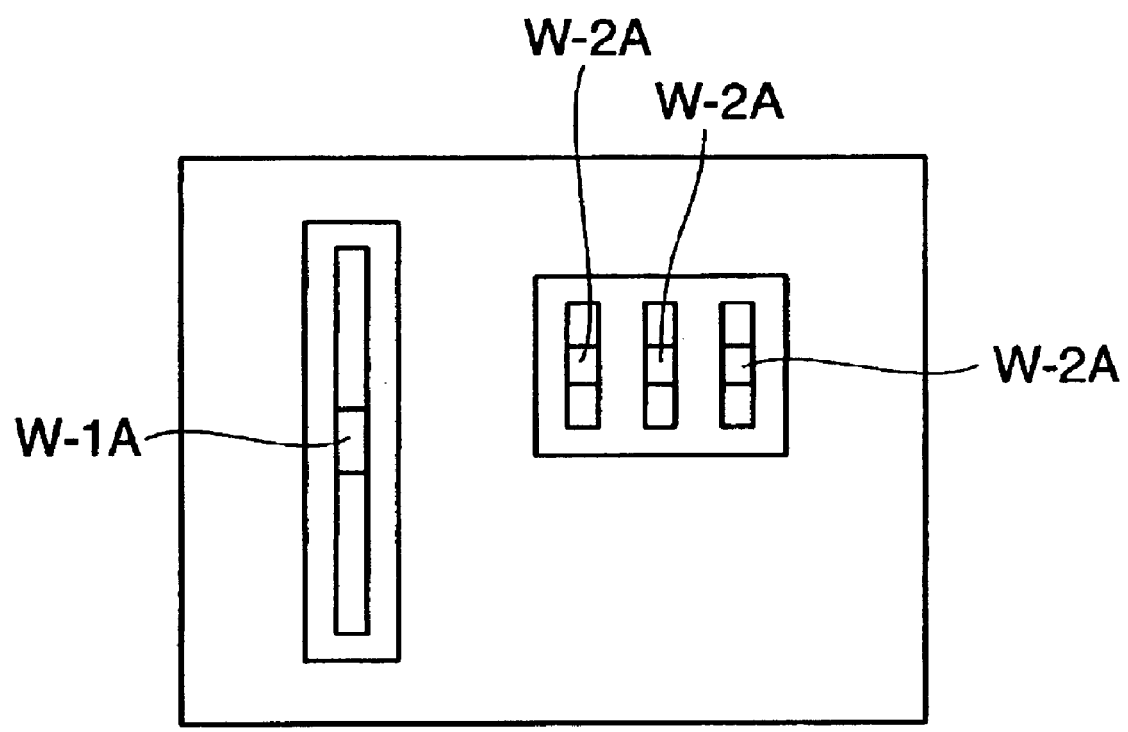

FIG. 9 is a plan view of FIG. 8. Ink supply holes W-1A and W-2A are formed in the middle portions of the respective grooves.

Figure 10:
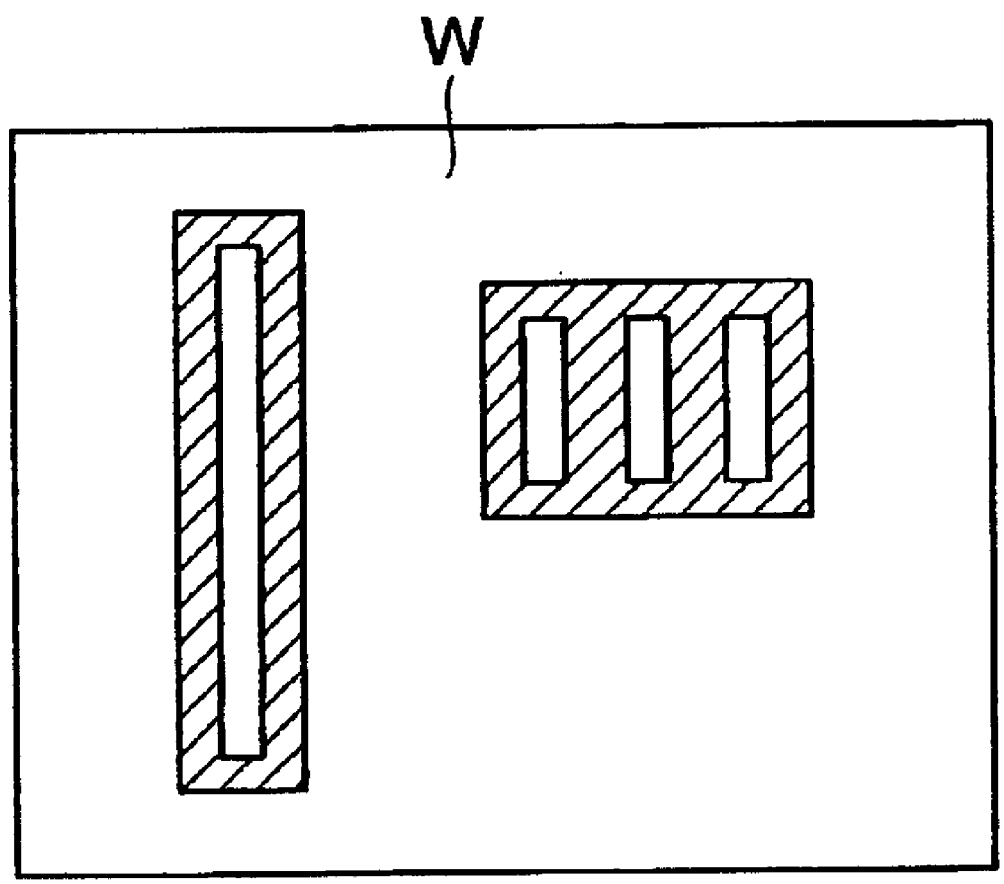

FIG. 10 shows the adhesive application positions on the work W in the step of applying an ultraviolet curing adhesive to predetermined positions on the work W in the work chamber 2B.

The adhesive is applied on thick frames painted in black in FIG. 10.

Figure 11:
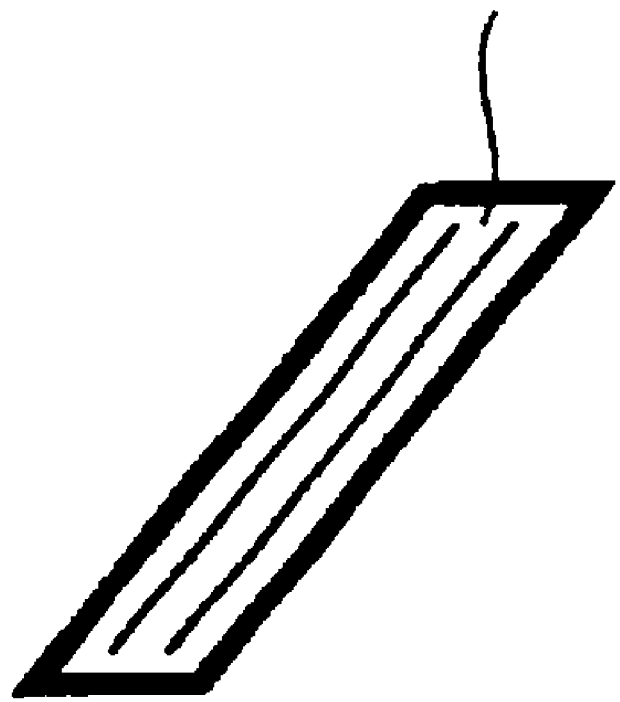

FIG. 11 shows a black ink discharging chip part P1 to be mounted at the adhesive application position on the work W.

The chip part P1 is in the form of a strip and made of silicon. Minute orifices are formed in two rows in the middle portion of the chip part P1 in the longitudinal direction.

Figure 12:
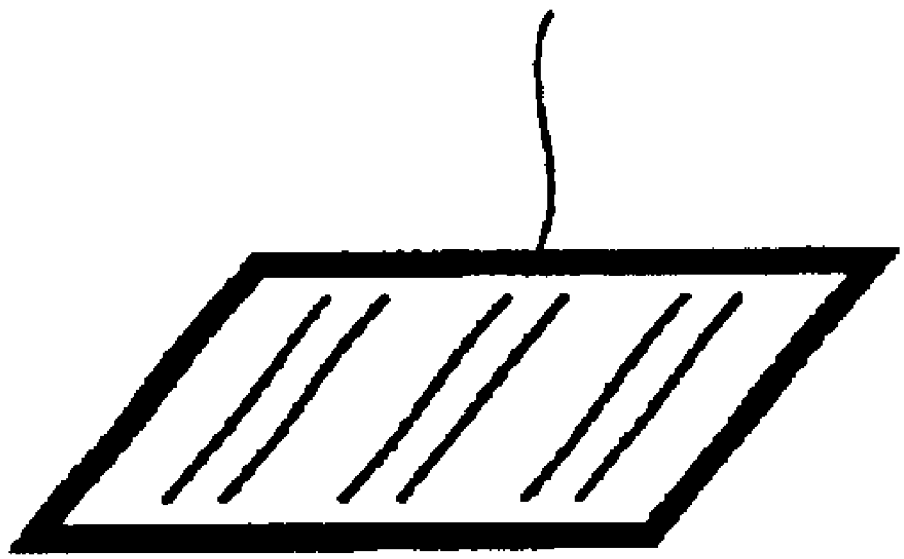

FIG. 12 shows a color ink discharging chip part P2.

This chip part is designed to be fitted in the groove portion W-2 in the work W. Orifices for discharging inks of three colors, i.e., red, yellow, and blue, are formed in the chip part P2.

Figure 13:
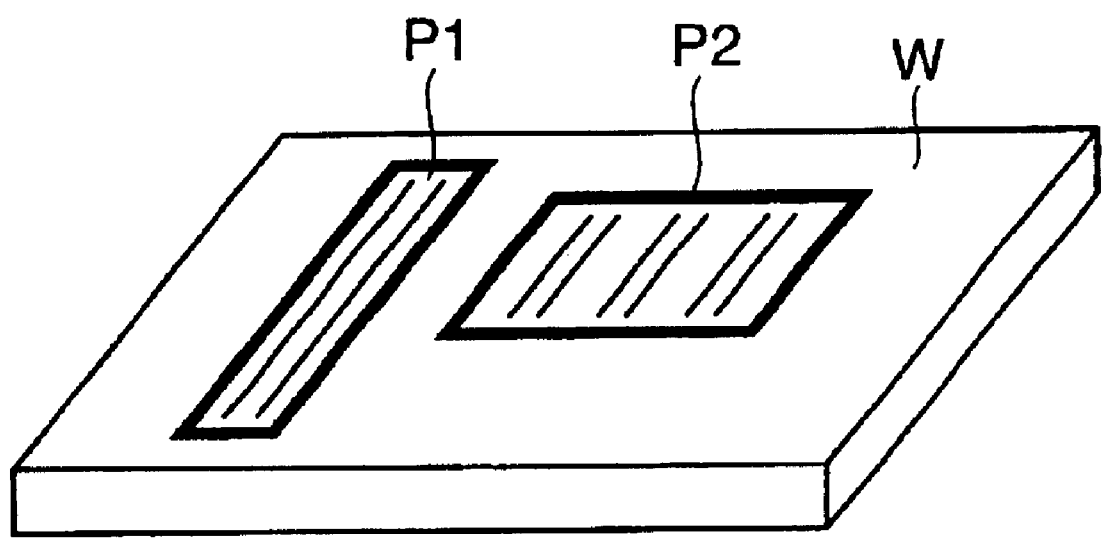

FIG. 13 shows a state wherein the respective chip parts are mounted on the work W.

(Description of Cleanliness)

As an embodiment of the present invention, a working method for an assembly process for an ink discharging unit of a printer designed to discharge ink is presented. The orifices in the chip parts P1 and P2 of the unit portion shown as an example in FIGS. 8 to 13 have diameters of 0.026 mm and 0.014 mm, respectively. These orifices, amounting to 319, are formed in the chip part P1 in the longitudinal direction, and those, amounting to 255×3 (colors)=765, are formed in the chip part P2 in the longitudinal direction. The printing precision of images and characters printed in inks discharged from the orifices is set to 1,200 dpi.

Under these conditions, this working apparatus is provided with a cleanliness that is so set as to limit the number of dust particles with a diameter of 5 µm entering the above orifices in the chip parts P1 and P2. In this embodiment, the cleanlinesses in the respective work chambers 2A, 2B, 2C, 2D, and 2E are set within the range of 100 dust particles or less with a diameter of 0.5 µm.

In this embodiment, the maximum air capacity of the air blowers 4A to 4E is set to 1.4 m$^3$/min, and the mesh degree of the filters of the cleaning means 6A, 6B, 6C, 6D, and 6E is so set as to cut 99.7% of dust particles with a particle diameter of 0.03 µm.

(Description Working Operation)

Operation in the working method for this working apparatus will be described with reference to the accompanying drawings.

(Loading of Work)

The door 18 of the loading chamber 2A shown in FIGS. 1 and 2 is opened, and the work W is placed on the transfer vehicle P-1 shown in FIG. 8. The door 18 is then closed.

Since the cleanliness in the loading chamber 2A decreases due to the opening/closing of the door 18, the air capacity of the air blower 4A is increased to send impurities in the direction of the stage base 2A-1, thereby restoring the cleanliness in the work region in the loading chamber 2A.

In this apparatus arrangement, in consideration of a decrease in the cleanliness in the loading chamber due to the opening/closing the door 18, the air capacity of the air blower 4A is increased by 50% for 10 sec after the door 18 is closed.

The opening/closing of the door 18, accompanying the loading of the work into the loading chamber, may affect the cleanliness in each adjacent work chamber. In this case, therefore, the air capacities of the air blowers in the remaining work chambers are also increased during the opening/closing period of the door of the loading chamber 2A to prevent impurities such as dust particles from being scattered in the work areas in the respective work chambers.

The operation of increasing the air capacity of each air blower is controlled in accordance with the detection of cleanliness by the cleanliness sensor placed in each work chamber.

(Application of Adhesive on Work)

After a work is loaded into the loading chamber 2A and the cleanliness in the work chamber 2B described above is detected, the transfer vehicle P-1 in the loading chamber is moved on the rails 8 to be transported into the work chamber 2B.

The transfer vehicle P-1 is stopped at a predetermined position in accordance with the detecting operation of a position sensor placed in the work chamber.

FIGS. 14 to 18 are views for explaining operation in the work chamber 2B.

Figure 14:
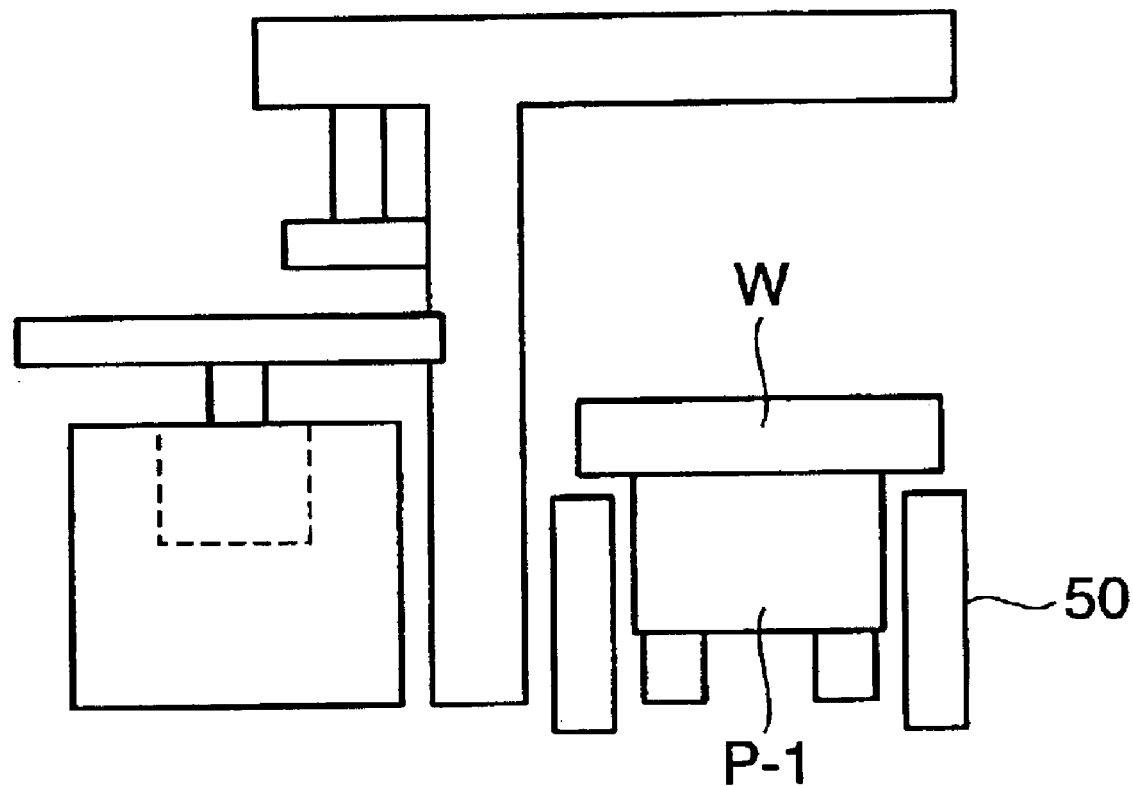
FIGS. 14 to 18 are views for explaining assembly operation.
Figure 15:
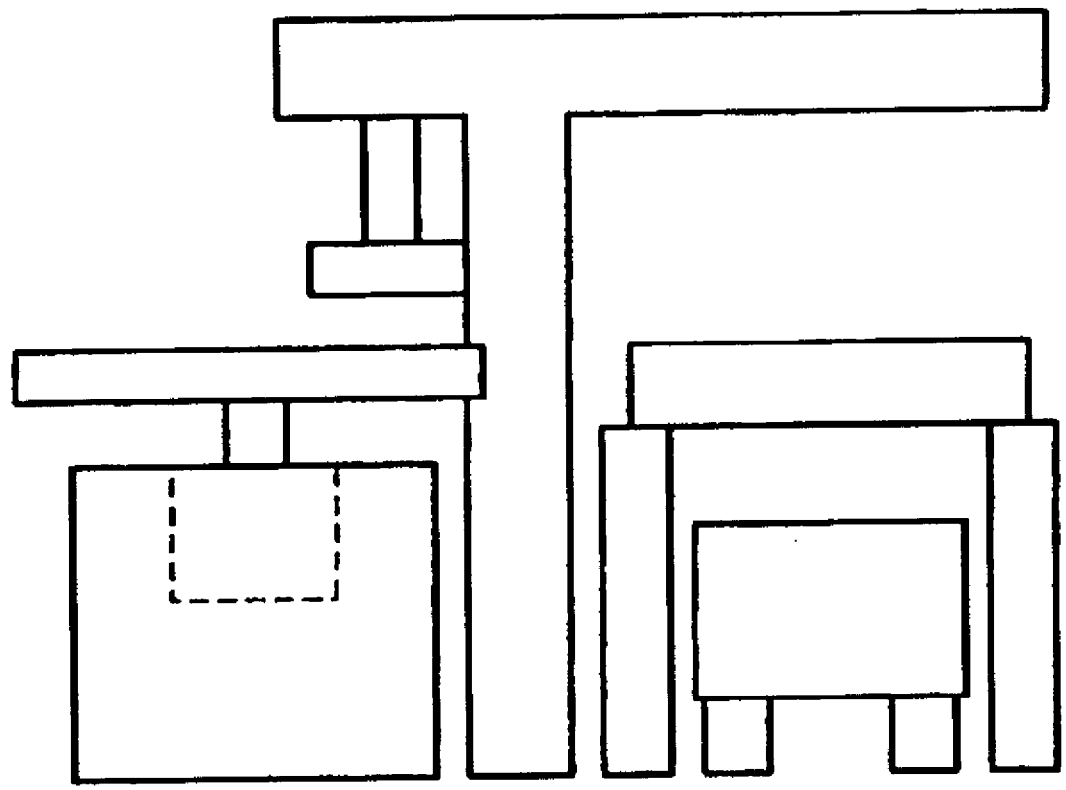
Figure 16:
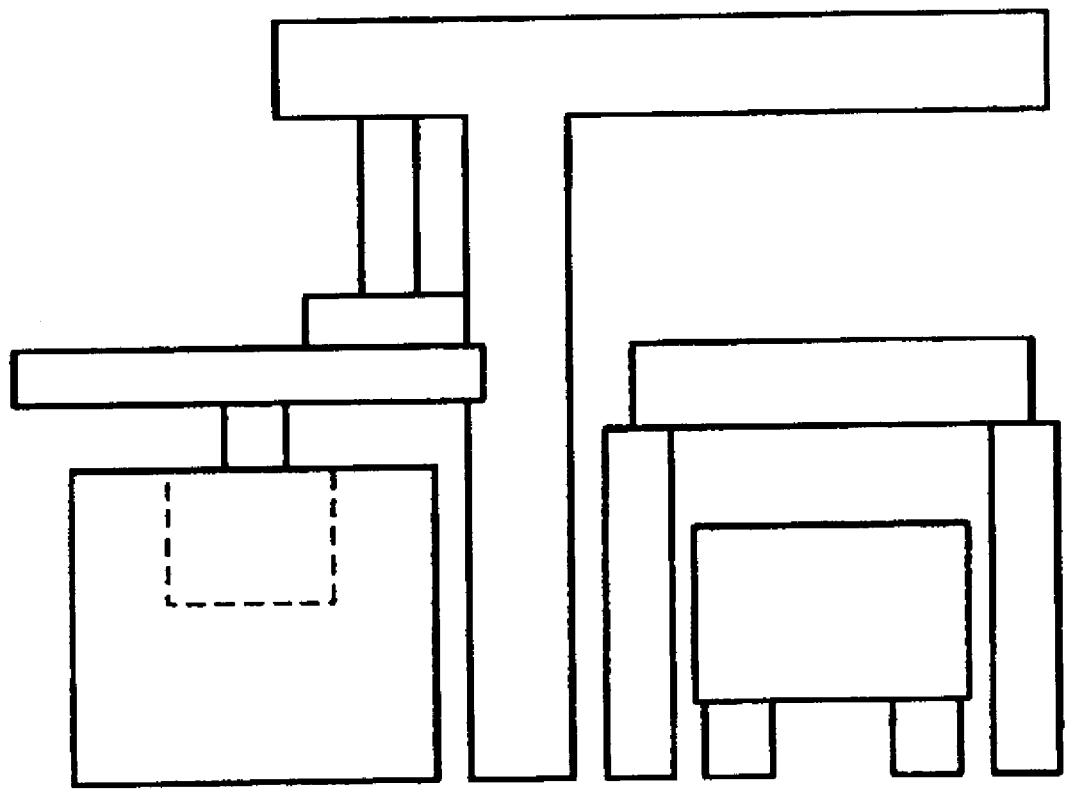
Figure 17:
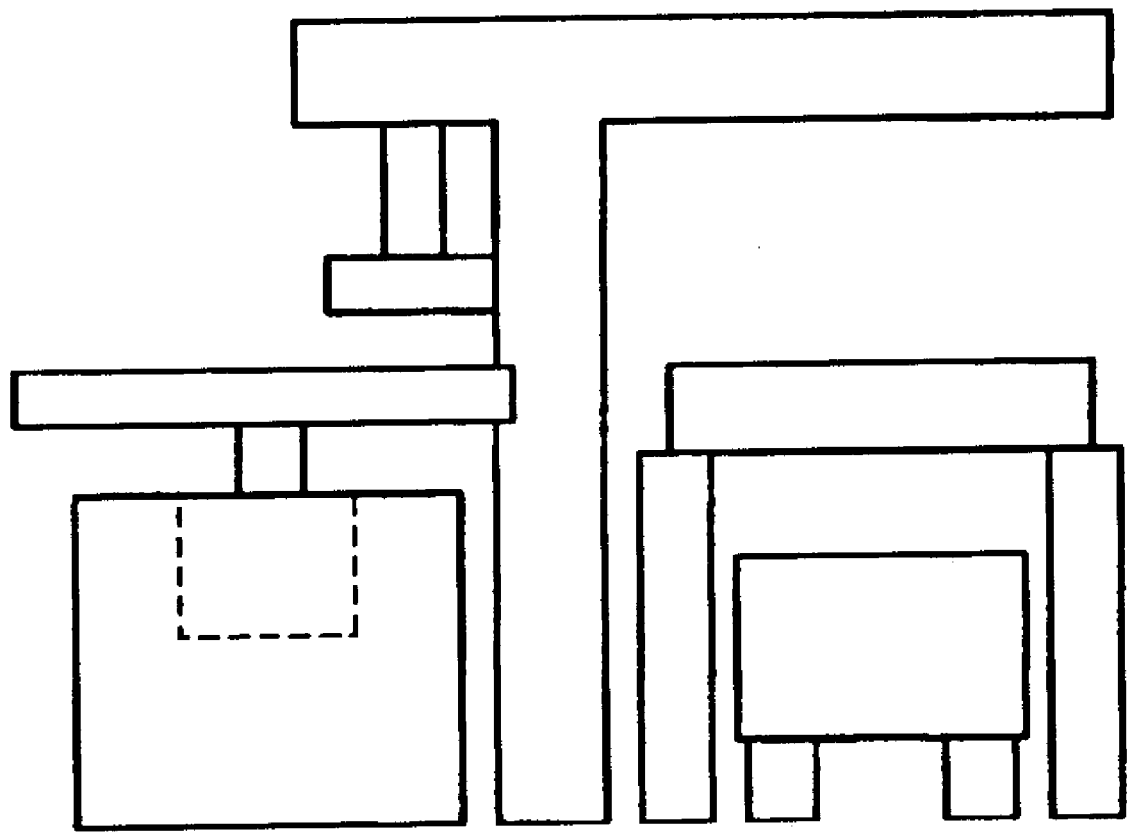
Figure 18:
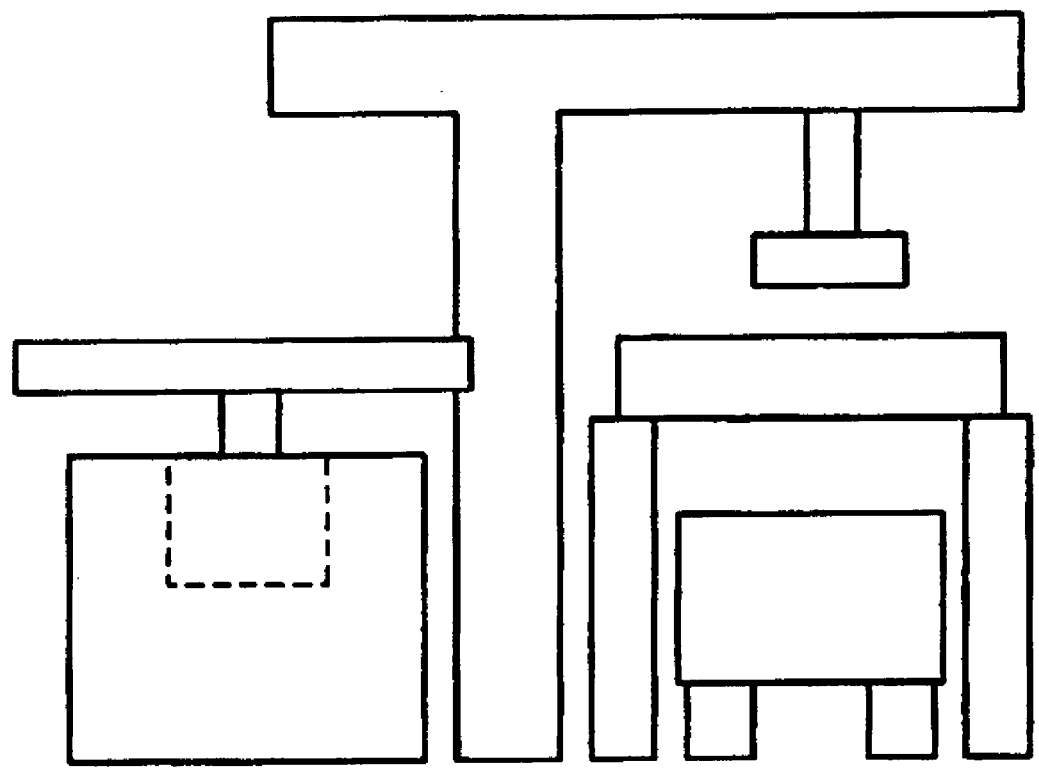

FIG. 14 shows a state wherein the transfer vehicle P-1 is stopped at the predetermined position. The work W on the transfer vehicle is held at a position above the transfer vehicle by an ejection means 50. This operation is done to work the work while it is held at a position where the cleanliness in the work chamber 2B is high.

The flow of processing then advances to the operation of supplying an adhesive onto the work by the adhesive supply means 22.

The transfer member of the adhesive supply means 22 moves downward into the supply plate to be coated with an adhesive in the transfer plate.

In this case, the shape of the transfer surface of the transfer member corresponds to the thick frames painted in black at the transfer positions of the adhesive in FIG. 10.

Subsequently, as shown in FIGS. 15 to 18, the transfer member is raised and rotated to transfer the adhesive onto the transfer positions on the floating work W shown in FIG. 10.

The transfer member is raised and rotated to wait at the standby position after the transfer operation is completed.

(Loading of Cassette)

The work W having undergone the step shown in FIGS. 14 to 18 is transferred from the work chamber 2B to the work chamber 2C.

The robot 30 shown in FIG. 5 mounts the chip parts P1 and P2 supplied from a cassette 32 in FIG. 6 on the work W, transferred to a predetermined position in the work chamber 2C, at the adhesive transfer positions shown in FIG. 10.

As described above, chip parts are arranged and stored on the tray 34 in the cassette 32 in another step, and a predetermined cleanliness is maintained in the cassette 32.

When the cassette 32 is mounted in a cassette mount portion 2C-C in the work chamber 2C, the first door 40B of the isolated region 42 of the work chamber 2C opens as the door 36 of the cassette 32 is mounted on the mount portion. The outer surface of the door 36 of the cassette is then cleaned by clean air sent from the air blower 4C above the isolated region, thereby cleaning up dust particles adhering the door and the like.

(Supply of Chip Parts)

The flow of processing then advances to the operation of loading chip parts from the cassette 32. In this operation, the tray 34 in the cassette 32 is loaded to a predetermined in the work chamber shown in FIG. 5 by the moving means 38A and 38B.

The loading position is a position where the suction hand 30A of the robot 30 performs suction operation.

As the tray 34 in the cassette is loaded/moved, the second door 40A of the work chamber 2C opens.

Subsequently, the robot 30 supplies the chip parts P1 and P2 on the tray 34 to the positions on the work W where the adhesive was transferred.

In the work chamber 2C, since air sent from the air blower 4C is maintained at the cleanliness described above by the cleaning means 6C, the orifices in the chip members are not clogged.

(Assembly and Curing)

After the chip parts are mounted on the work W by the robot 30, the transfer vehicle P-1 is transported into the work chamber 2D.

The ultraviolet curing adhesive on the work transferred to the work chamber 2D, on which the chip parts have been mounted, is irradiated with ultraviolet radiation to fix the chip parts on the work.

In the curing step by ultraviolet irradiation in the work chamber 2C, air sent from the air blower 4D is maintained at the cleanliness described above by the cleaning means 6D to prevent dust particles from adhering to the assembled parts.

(Unloading of Work)

The work assembled in the work chamber 2D is transferred to the unloading chamber 2E by the transfer vehicle.

In the unloading chamber 2E, the work is unloaded by opening/closing operation of the door 20.

In the above manner, the process from loading the work into the loading chamber to the assembly step is completed.

As the door 20 of the unloading chamber is opened and closed, dust particles in the open air may enter the loading chamber to scatter dust particles in the remaining work chambers, resulting in a decrease in cleanliness in the remaining work chambers.

In this embodiment, the air capacities of the air blowers in the work chambers 2A, 2B, 2C, 2D, and 2E are increased at the time of loading and unloading so as to prevent dust particles from being scattered in the respective work chambers.

The present invention is not limited to the above embodiments and various changes and modifications can be made within the spirit and scope of the present invention. Therefore, to apprise the public of the scope of the present invention, the following claims are made.

What is claimed is:

1. A cassette which loads a part into a work chamber in which a cleanliness is maintained, comprising:

connection means for connection to a connection portion of the work chamber;

a door which opens upon connection to the connection portion;

a tray which stores the part in said cassette; and means for loading said tray into said work chamber while floating said tray inside said cassette.

2. A unit for a printing apparatus which has a liquid discharging nozzle mounted on a substrate, wherein said unit is worked by a working apparatus having a plurality of work chambers in which a predetermined cleanliness is maintained, and a cassette which can be coupled to the work chamber and supplies the nozzle, and the substrate and the nozzle are worked in an atmosphere with a predetermined cleanliness.

* * * * *

UNITED STATES PATENT AND TRADEMARK OFFICE
CERTIFICATE OF CORRECTION

PATENT NO. : 6,840,594 B2
DATED : January 11, 2005
INVENTOR(S) : Shuichi Hirasawa et al.

It is certified that error appears in the above-identified patent and that said Letters Patent is hereby corrected as shown below:

Column 9,
Line 19, "cleanlinesses" should read -- cleanliness --.

Column 10,
Line 44, "predetermined" should read -- predetermined chamber --.

Signed and Sealed this

Twenty-first Day of March, 2006

JON W. DUDAS
*Director of the United States Patent and Trademark Office*